United States Patent [19]
Hshieh et al.

[11] Patent Number: 5,763,914
[45] Date of Patent: Jun. 9, 1998

[54] CELL TOPOLOGY FOR POWER TRANSISTORS WITH INCREASED PACKING DENSITY

[75] Inventors: Fwu-Iuan Hshieh, Saratoga; Danny Chi Nim, San Jose, both of Calif.

[73] Assignee: MegaMOS Corporation, San Jose, Calif.

[21] Appl. No.: 895,507

[22] Filed: Jul. 16, 1997

[51] Int. Cl.⁶ .................. H01L 29/76; H01L 29/94; H01L 31/062; H01L 31/113
[52] U.S. Cl. .................. 257/329; 257/330; 257/341
[58] Field of Search .................. 257/329, 330, 257/341

[56] References Cited

U.S. PATENT DOCUMENTS

| | | |
|---|---|---|
| 5,304,831 | 4/1994 | Yilmaz et al. |
| 5,323,036 | 6/1994 | Neilson et al. |
| 5,410,170 | 4/1995 | Bulucea et al. |

FOREIGN PATENT DOCUMENTS

| | | |
|---|---|---|
| 3920010 | 12/1989 | Germany. |
| 5-335582 | 12/1993 | Japan. |

*Primary Examiner*—Stephen Meier
*Attorney, Agent, or Firm*—Bo-In Lin

[57] ABSTRACT

The present invention discloses a power transistor cell supported on a semiconductor substrate with a top surface and a bottom surface. The power transistor cell includes a drain region, doped with impurities of a first conductivity type, formed at the bottom surface. The power transistor cell further includes a polysilicon gate layer overlaying the top surface includes a polysilicon opening disposed substantially in a central portion of the transistor cell with a remaining portion of the polysilicon layer constituting a gate and defining an outer boundary for the transistor cell wherein the polysilicon opening and the outer boundary defined by the gate for the transistor cell constituting substantially non-orthogonal parallelograms. The power transistor further includes a source region, doped with the first conductivity type, disposed in the substrate underneath and around an outer edge of the source opening with a small portion extends underneath the gate. The power transistor further includes a body region, doped with a second conductivity type, disposed in the substrate surrounding the source region and an entire portion of the substrate underneath the polysilicon opening having a small portion extends underneath the gate near the cell boundary. The packing density of the transistor cell is improved with the parallelogram cell occupies less areas than the regular square cell having the same total channel width.

37 Claims, 13 Drawing Sheets

CELL TOPOLOGY FOR POWER TRANSISTORS WITH INCREASED PACKING DENSITY

BACKGROUND OF THE INVENTION

1. Field of the Invention

This invention relates generally to the structure and fabrication process of integrated circuit (IC) power transistors. More particularly, this invention relates to a novel and improved cell topology to achieve higher packing density which is defined as total channel width per unit cell area, to improve the current conduction of the power transistors.

2. Description of the Prior Art

Several technical difficulties are encountered by those involved in designing and manufacturing power transistors employing conventional structure and processing steps for fabricating a power metal oxide silicon field effect transistor (MOSFET). Specifically, conventional planar cellular structure of power MOSFETs, such as square, circular, and hexagonal topologies are limited by the difficulty that the on-resistance is increased due to the reduction in polysilicon gate width which causes the JFET resistance to increase. Particularly, when the cell size is reduced in order to manufacture power device with higher cell density, the dimension of the cell and also width of the polysilicon gates are reduced. Since the on-resistance is inversely proportional to the width of the polysilicon gate, as the cell size is reduced, the width of the polysilicon gate is decreased and the on-resistance is increased. Therefore, the requirement to maintain a low level of on-resistance becomes a major design difficulty and hindrance to manufacture power device with cell density higher than 6.5 million cells/in$^2$ since the increased JFET resistance cancels out the reduction in channel resistance when the unit cell size is shrunken.

Figure 1:
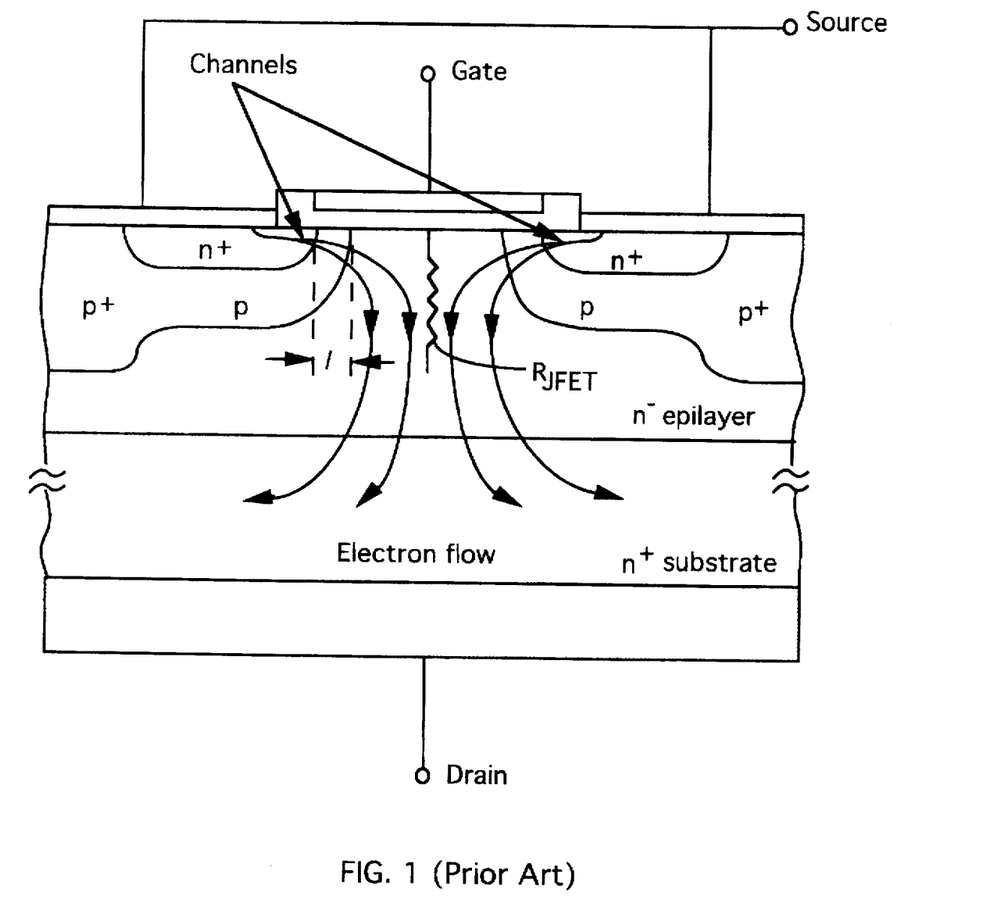
FIG. 1 is a cross-sectional view of a prior art structure of a general MOSFET.

In order to better understand the difficulties encountered in the prior art, general descriptions for the techniques currently employed for fabricating power MOSFET devices are first discussed. FIG. 1 shows a typical vertical double diffused MOS (VDMOS) device which uses a double diffusion technique to control the channel length 1. Two successive diffusions are performed with first a p diffusion using boron, then a n+ diffusion using either arsenic or phosphorus, to produce two closely spaced pn junctions at different depths below the silicon surface. With this pn-junction, as shown in FIG. 1, the VDMOS supports the drain voltage vertically in the n$^-$ epilayer. The current flows laterally from the source through the channel, parallel to the surface of the silicon. The current flow then turns through a right angle to flow vertically down through the drain epilayer to the substrate and to the drain contact. The p-type "body" region in which the channel is formed when a sufficient positive voltage is applied, and the n$^+$ source contact regions are diffused successively through the same window etched in the oxide layer. However, the current must first pass through the resistance of a parasitic JFET zone between two body-regions. The JFET resistance is inversely proportional to the width of the polysilicon gate. As the width of the polysilicon gate is reduced for the purpose of shrinking the size of the power transistor cells to obtain power device with higher cell density, the JFET resistance is increased.

Figure 2A:
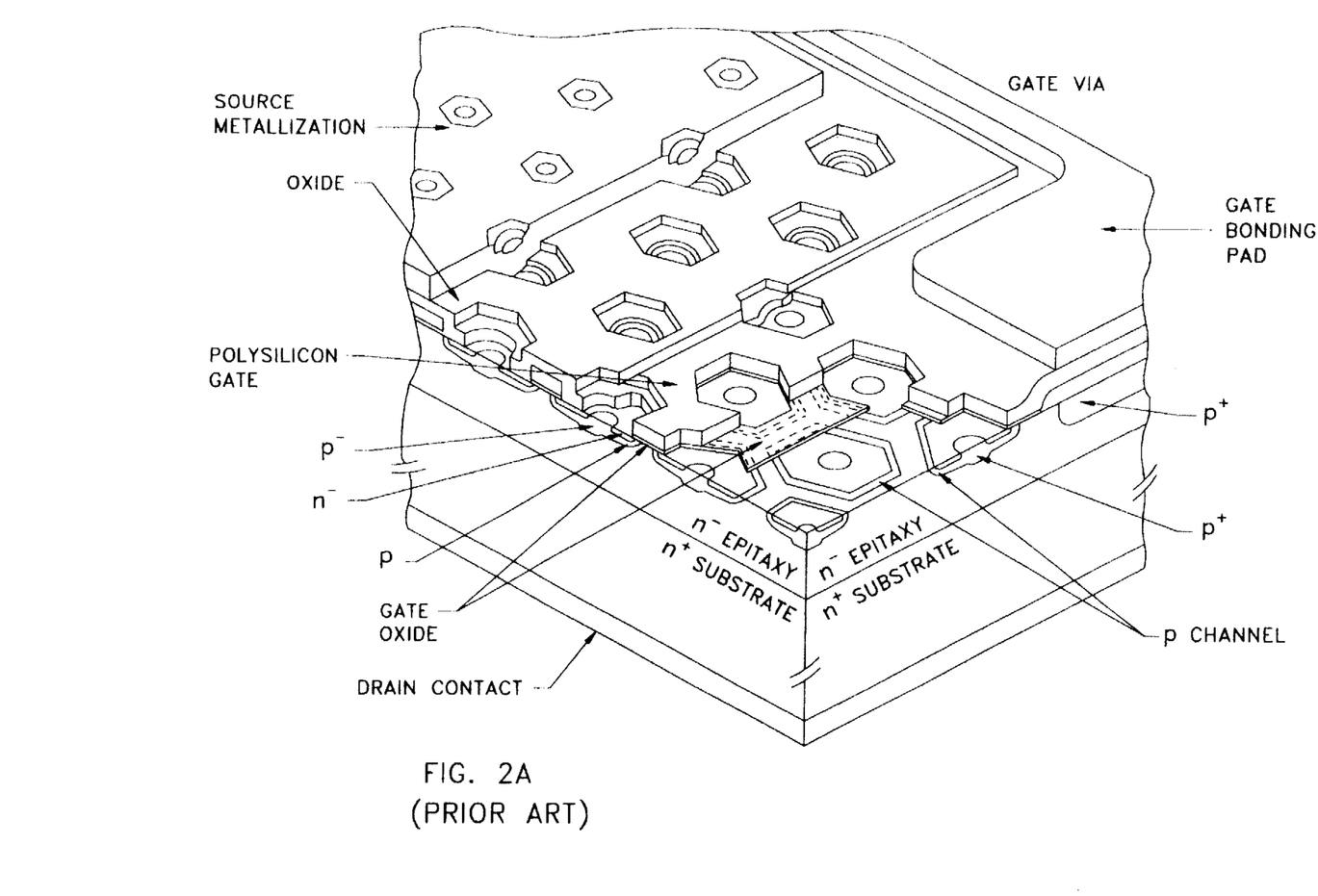
FIGS. 2A to 2B are partial perspective views of the layer structure of a prior art hexagonal and square MOSFET respectively.
Figure 2B:
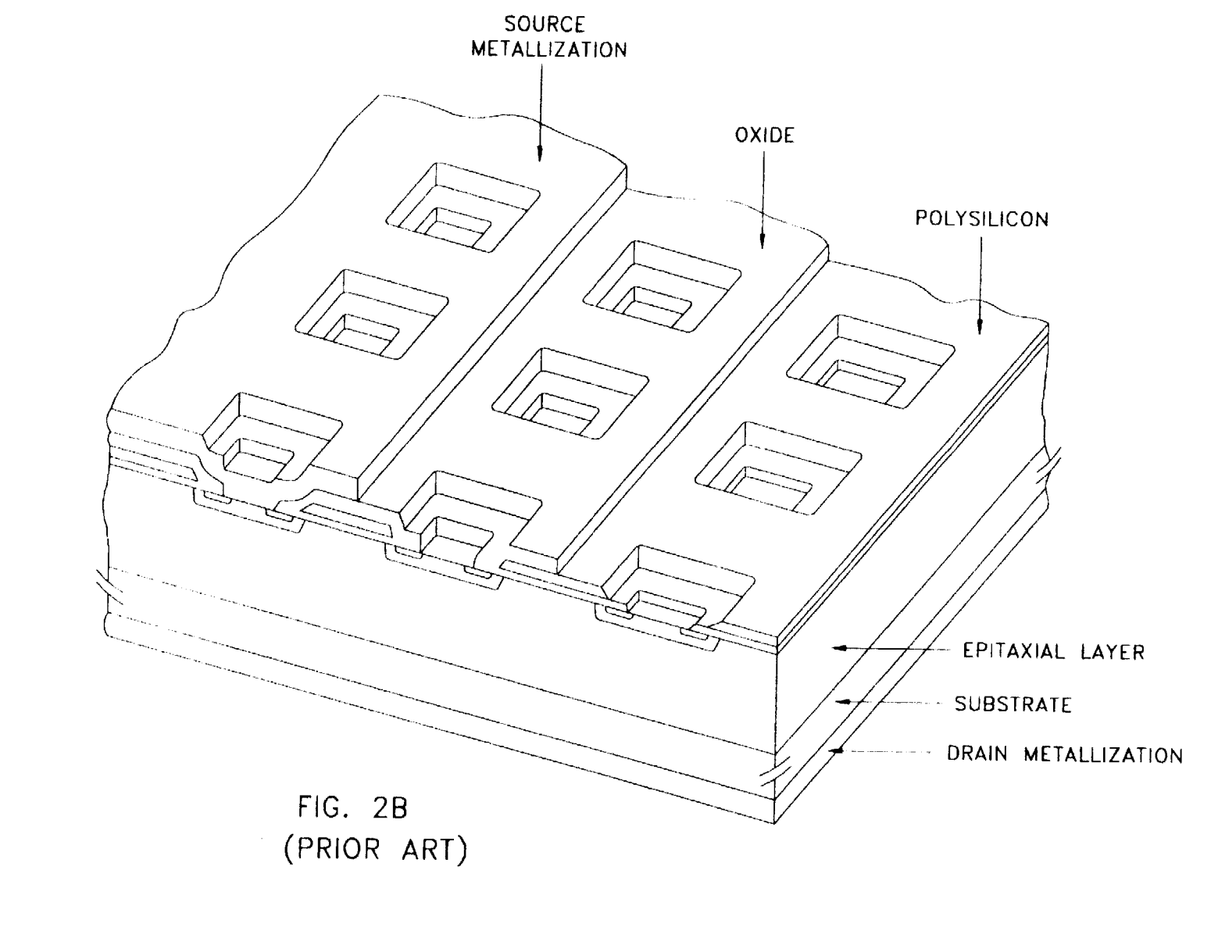
Figure 2C:
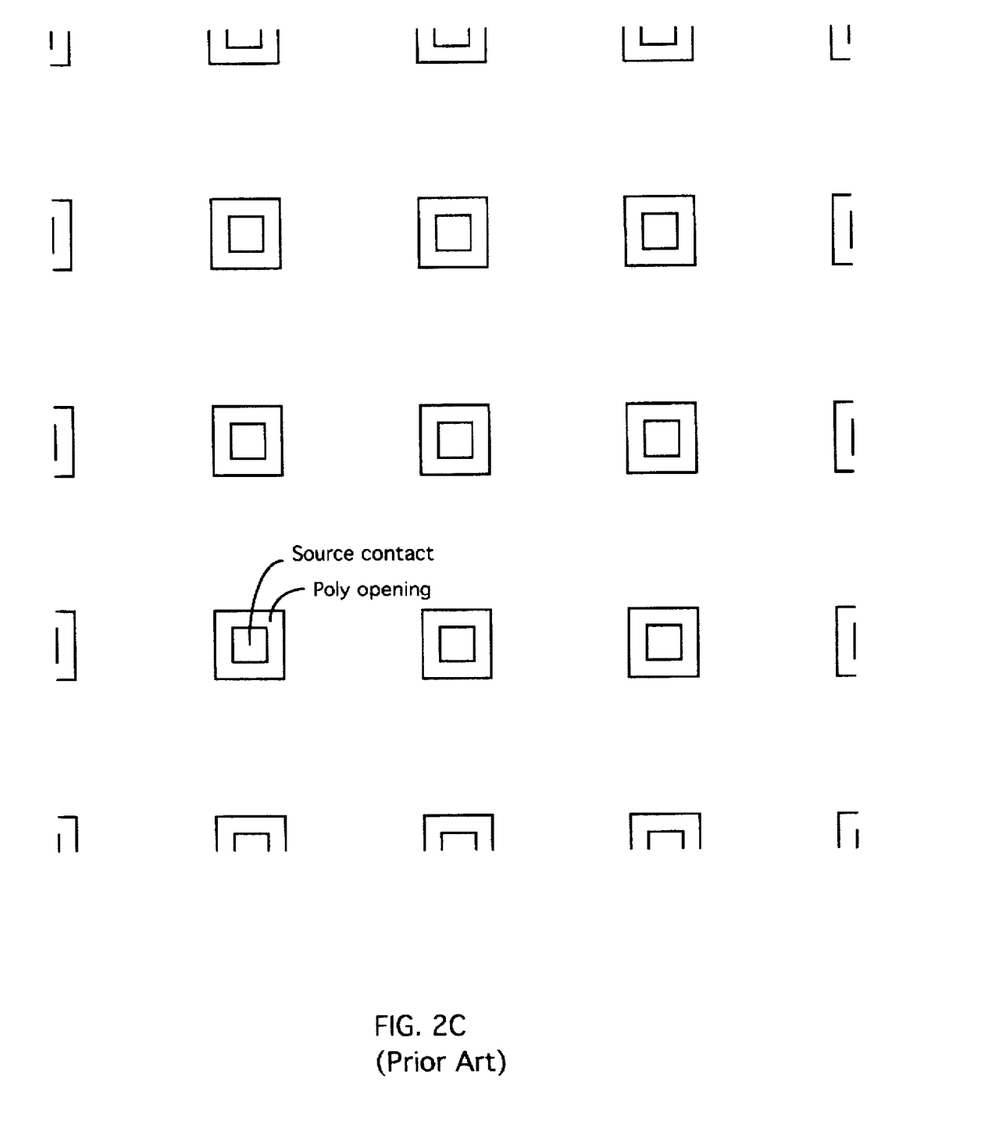
FIGS. 2C to 2D are top views of the prior art cell arrangements of the square MOSFET of FIG. 2B.
Figure 2D:
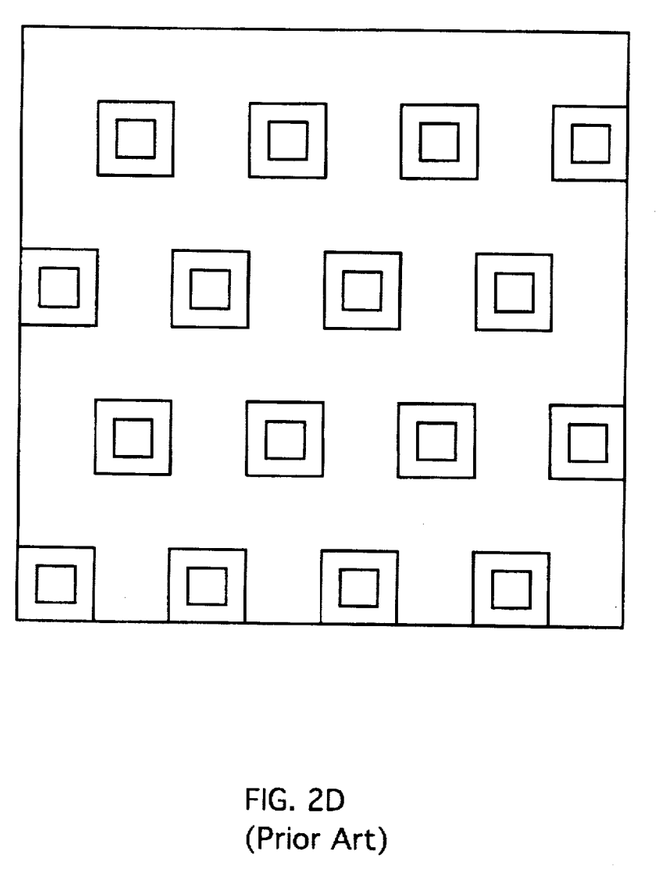

In order to best utilize the silicon, the power MOSFET device is fabricated by employing a cellular structure as that shown in FIGS. 2A and 2B. Several different schemes are used. High current capability is obtained by connecting many cells together in parallel as will be discussed below. As shown in FIG. 2B, heavily doped polycrystalline silicon is used as gate electrode. For power MOSFETs, it has several advantages because it simplifies the connection metalization process where an oxide layer can be formed over the polysilicon and the source metalization may then be extended over the whole of the upper surface. The polysilicon, used as gate electrodes, can be deposited with great accuracy and the gate oxide is more stable and less prone to contamination than the aluminum gate. Furthermore, the source is self aligned automatically with the gate edge thus greatly simplifies the fabrication process. FIGS. 2C and 2D shows the top views of two alternate square cell arrangements wherein the central dark squares represent the polysilicon gate and the outer squares represent the area occupied by the source region of each cell. The cell arrangement in FIG. 2C is commonly referred to as a "square on square" cell topology while that shown in FIG. 2D is a "square on hexagon" cell topology.

Yilmez et al. disclose in U.S. Pat. No. 5,304,831 (issued on Apr. 19, 1994) entitled "Low On-Resistance Power MOS Technology", a power MOSFET cell which has cell topology to reduce the three dimension diffusion phenomenon which is more pronounced with p-type dopant particular with short channel length. The three dimensional diffusion effect which often leads to vulnerable punch-through weak points in the corners of a square cell is circumvented by blunting the sharp corners in the square cells. The ninety degree corners of the polysilicon is made blunt by adding a short linear segment and replacing a 90-degree with two 135-degree corners. The cell topology thus renders the three-dimensional diffusion phenomenon less problematic at the corners when the shallow junctions are formed for high density power transistor cells with channel length reduced to a range between 0.5 to 0.75 microns. While Yilmez et al. disclose a solution to overcome the difficult in the square cells with corner vulnerability, the limitation of higher on-resistance with reduced cell size which commonly represented by a packing density parameter is still not resolved. The packing density is defined as:

$$\text{Packing Density} = \frac{\text{Unit cell channel width}}{\text{Unit cell area}} \quad (1)$$

Figure 3A:
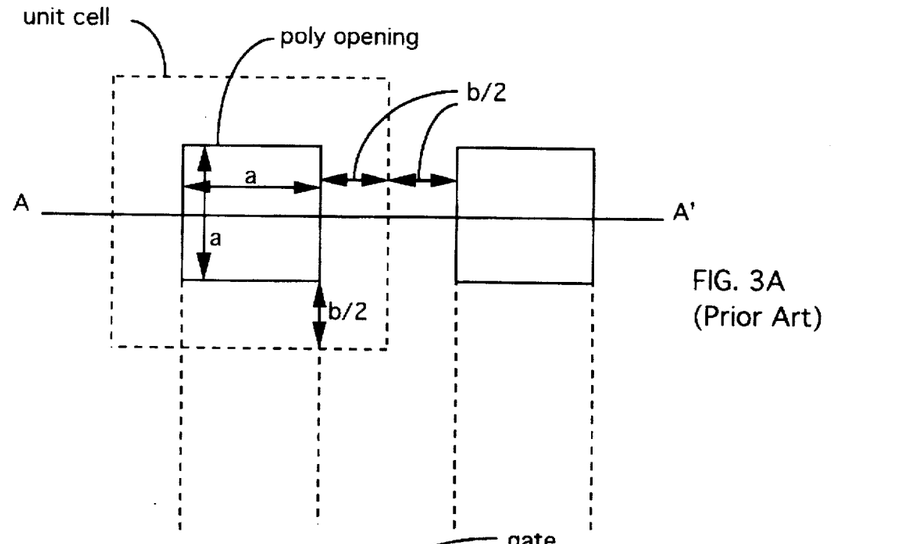
FIGS. 3A and 3B show a top view and a cross sectional view of a prior art MOSFET cell topology and the packing density of the cell.
Figure 3B:
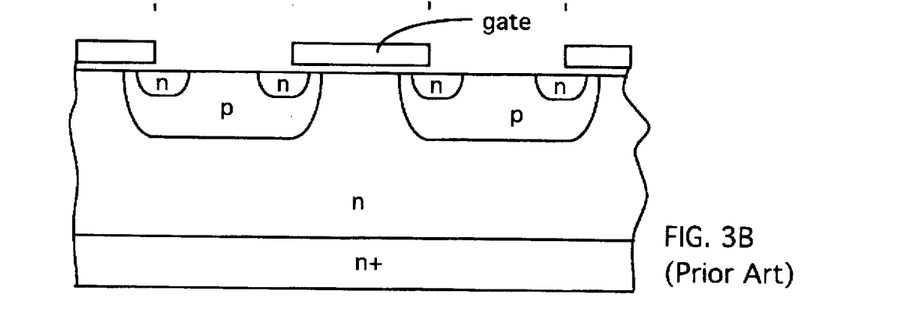

Referring to FIGS. 3A and 3B, for a regular square cell, the total channel width is 4a and the total cell area is (a+b)$^2$. The packing density for this typical square cell is therefore:

$$\text{Cell Packing Density} = 4a/(a+b)^2 \quad (2)$$

From equation (1), a person of ordinary skill in the art can appreciate that as long as the cell topology is substantially a square shape, the blunting of the corners would not significantly change the packing density of the cell.

Therefore, there is still a need in the art of power device fabrication, particularly for power MOSFET design and fabrication, to provide a cell topology and fabrication process that would resolve these limitations.

SUMMARY OF THE PRESENT INVENTION

It is therefore an object of the present invention to provide a new and improved MOSFET cell topology, and fabrication process with masks configured according the novel cell topology to overcome the aforementioned limitations encountered in the prior art.

Specifically, it is an object of the present invention to provide a new and improved MOSFET cell topology wherein the packing density is increased by manufacturing the transistor cells as non-orthogonal parallelograms wherein the packing density is increased with the same total channel width formed in a smaller cell area when compared to that of square cells as that commonly used in the prior art such that the cell size can be further reduced without sacrificing the total channel width.

Another object of the present invention is to provide a new and improved MOSFET cell topology wherein the packing density is increased by manufacturing the transistor cells as non-orthogonal parallelograms with the sharper corner blunted or rounded whereby the packing density is increased with the same total channel width formed in a smaller cell area while the punch through vulnerability at the weak points in these sharper corners of the non-orthogonal parallelogram cells may be eliminated.

Another object of the present invention is to provide a new and improved MOSFET cell topology wherein the packing density is increased by manufacturing the transistor cells as non-orthogonal parallelograms whereby the packing density is increased with the same total channel width formed in a smaller cell area while the processing flow employed in manufacturing the transistor cells can be applied without requiring significant changes thus greatly simplifying a switch over to the new transistor cell topology of this invention.

Briefly, in a preferred embodiment, the present invention includes a power transistor cell supported on a semiconductor substrate with a top surface and a bottom surface. The power transistor cell includes a drain region, doped with impurities of a first conductivity type, formed at the bottom surface. The power transistor cell further includes a polysilicon gate layer overlaying the top surface includes a polysilicon opening disposed substantially in a central portion of the transistor cell with a remaining portion of the polysilicon layer constituting a gate and defining an outer boundary for the transistor cell wherein the polysilicon opening and the outer boundary defined by the gate for the transistor cell constituting substantially non-orthogonal parallelograms. The power transistor further includes a source region, doped with the first conductivity type, disposed in the substrate underneath and around an outer edge of the source opening with a small portion extends underneath the gate. The power transistor further includes a body region, doped with a second conductivity type, disposed in the substrate surrounding the source region and an entire portion of the substrate underneath the polysilicon opening having a small portion extends underneath the gate near the cell boundary. The packing density of the transistor cell is improved with the parallelogram cell occupies less areas than the regular square cell having the same total channel width.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 4A:
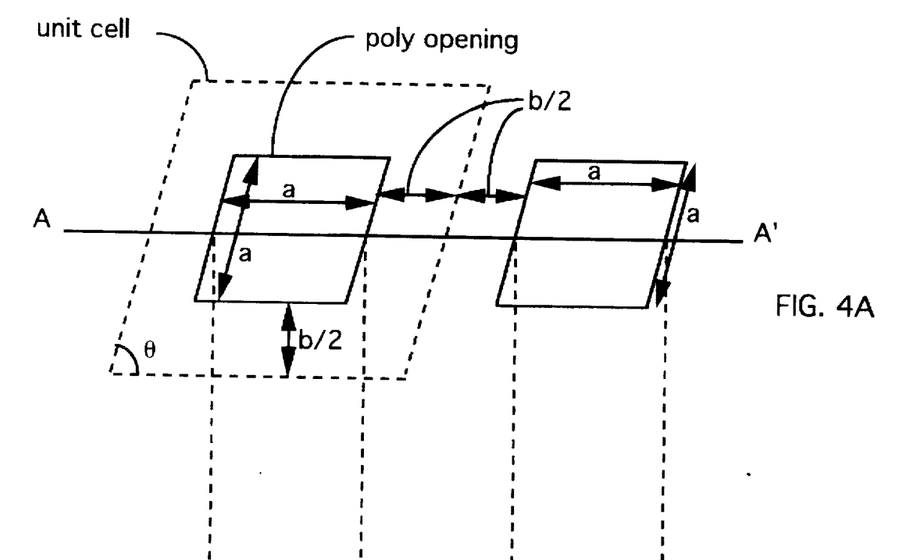
FIGS. 4A and 4B show a top view and a cross sectional view of a MOSFET cell topology and the packing density of the cell of this invention.
Figure 4B:
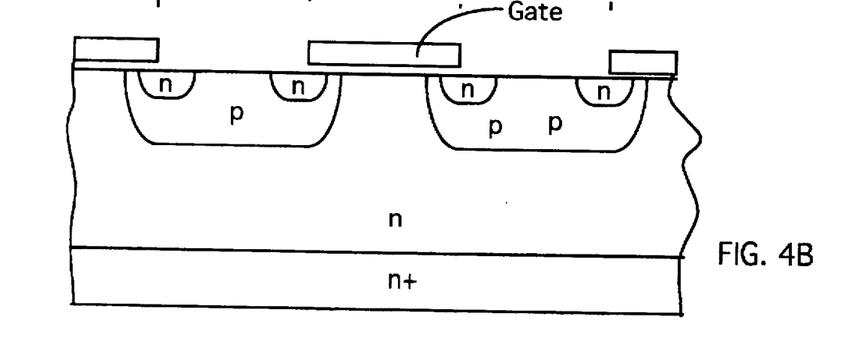

Referring to FIGS. 4A and 4B for a top view and a cross sectional view respectively for the power transistor cells 100 of the present invention. The transistor cells 100 are configured with a novel cell topology that the cell are formed to have a non-orthogonal parallelogram shape instead of the regular square, rectangular, or hexagonal shapes. For the purpose of illustration, the transistor cells 100 of parallelogram shape are formed to have the shaper corners opened between the horizontal and the tilted vertical boundary lines with an angle θ which is less than 90-degrees, as that shown in FIGS. 4A and 4B. The packing density for the transistor cells 100 can be computed according the definition provided in Equation (1) as $$\text{Cell Packing Density} = 4a/[(a+b)^2 \text{ SIN } \theta] \quad (3)$$

Since SIN θ is always smaller or equal to 1.0, the packing density for the transistor cell is increased. For example, if the sharper corners have a an angle of sixty-degrees, then there is about 16% improvement in packing density. By employing a cell topology of non-orthogonal parallelogram shape, a reduction of the total cell area of $(a+b)^2(1-\text{SIN}\theta)$ can be achieved without sacrificing the total channel width which is maintained at the same value of 4a. The percentage of the improvement of the packing density for the transistor cell according to this invention can be computed as:

$$\% \text{ of Packing Density Improvement} = 100[(1/\text{SIN}\theta)-1] \quad (4)$$

Figure 5A:
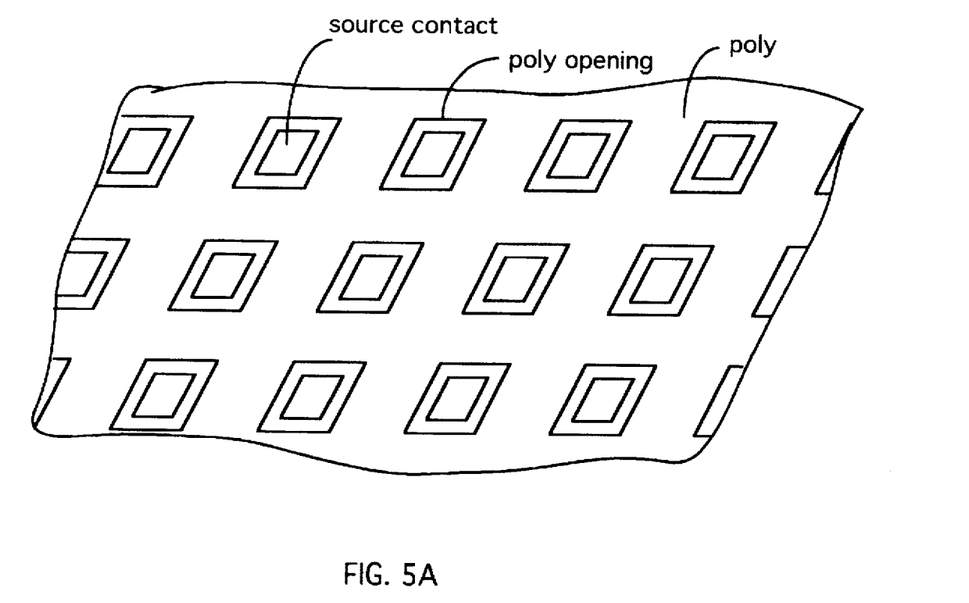
FIG. 5A and 5B show the transistor cell arrangement respectively in parallelogram centered at lattice points of a hexagonal lattice and parallelogram centered at lattice points of a parallelogram lattice configuration.
Figure 5B:
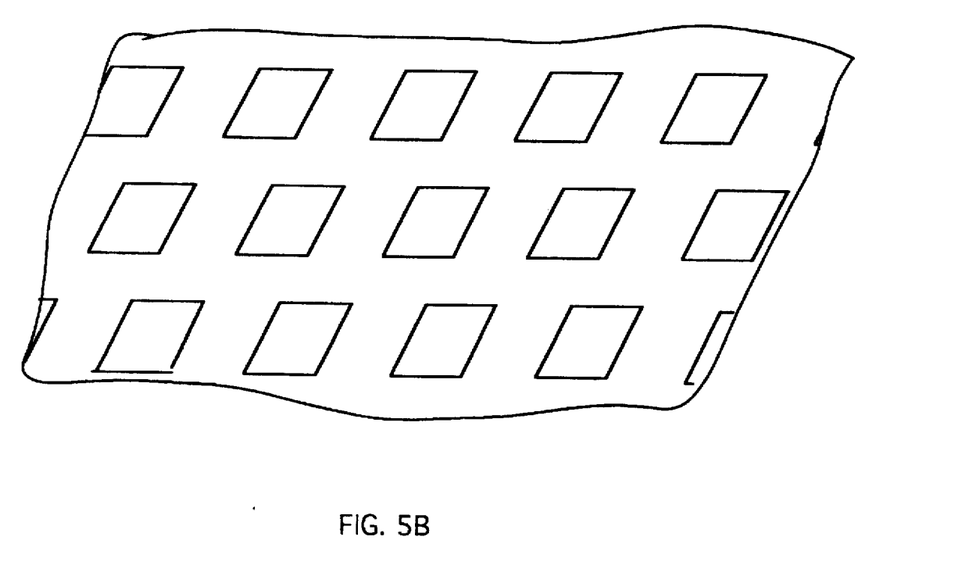

The non-orthogonal parallelogram cells can be arranged in the configurations with either the parallelogram centered at lattice points of a hexagonal lattice or parallelogram centered at lattice points of a parallelogram lattice configuration as that shown in FIGS. 5A and 5B respectively. Alternatively, the non-orthogonal parallelogram cells can also be arranged as a parallelogram centered at lattice points of a square lattice configuration (not shown) depending on convenience of manufacture, packaging and device application considerations.

Figure 6A:
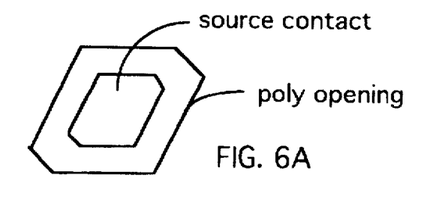
FIGS. 6A and 6B show the transistor cells with polysilicon openings have the sharp corners blunted and rounded respectively to remove punch through vulnerable points at the sharp corners of the parallelogram cells.
Figure 6B:
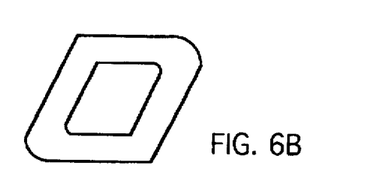

In order to prevent the corner vulnerability where punch through weak points may be formed at the sharp corners due to a three-dimension diffusion effect, similar to that discussed above in U.S. Pat. No. 5,304,831 by Yilmaz et al., the sharp corners of the polysilicon openings can be either blunted or rounded as that shown in FIGS. 6A and 6B respectively. Compared to the cell topology disclosed by Yilmaz et al., the present invention achieves higher packing density by implementing a non-orthogonal parallelogram cell topology. The power transistor implemented with cell configuration of this invention can therefore be manufactured with higher cell density without sacrificing the total channel width because the cells of non-orthogonal parallelogram shapes occupy less total area than a regular square cell.

Figure 7A:
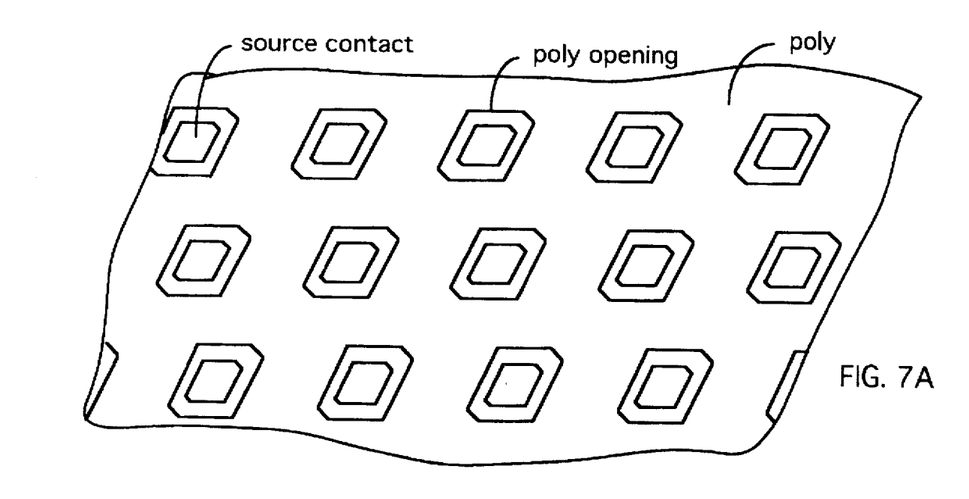
FIGS. 7A and 7B show the transistor cell arrangement respectively in parallelogram centered at lattice points of a hexagonal lattice and parallelogram centered at lattice points of parallelogram lattice configurations of the blunted sharp-corner parallelogram cells.
Figure 7B:
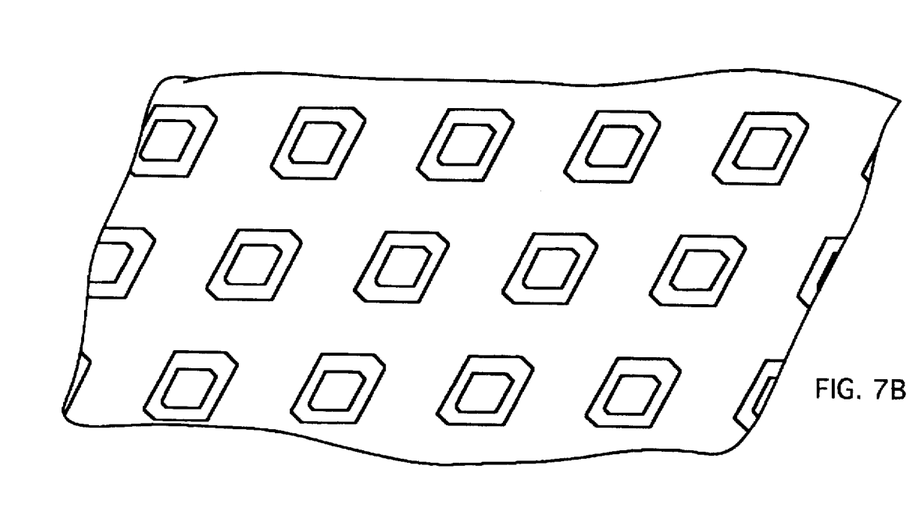
Figure 8A:
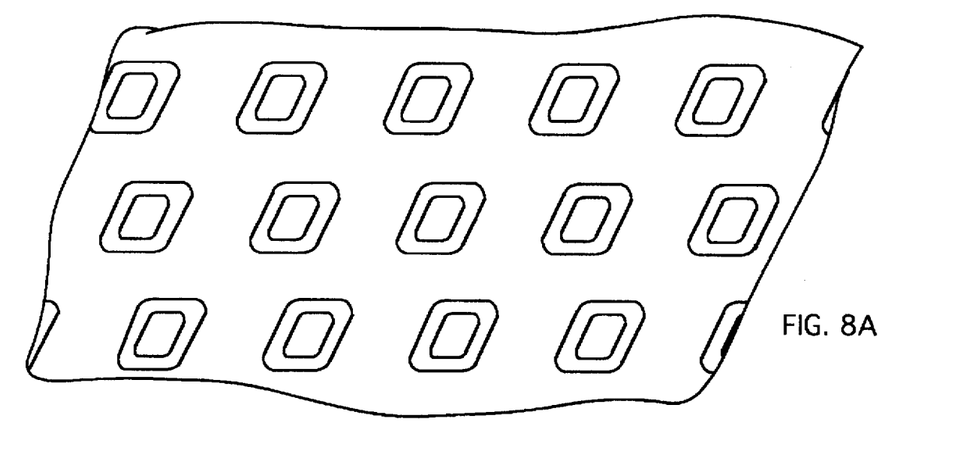
FIGS. 8A and 8B show the transistor cell arrangement respectively in parallelogram centered at lattice points of a hexagonal lattice and parallelogram centered at lattice points of a parallelogram lattice configurations of the rounded sharp-corner parallelogram cells.
Figure 8B:
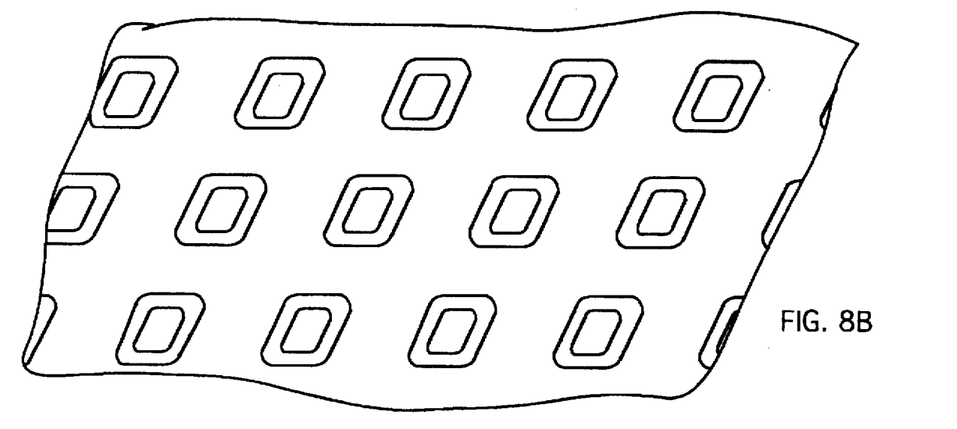

Referring to FIGS. 7A and 7B for the power devices which include transistor cells of blunted non-orthogonal parallelogram cells arranged respectively in parallelogram centered at lattice points of a hexagonal lattice and parallelogram centered at lattice points of a parallelogram lattice configurations. Alternately, FIGS. 8A and 8B illustrate the power devices which include transistor cells of rounded non-orthogonal parallelogram cells arranged respectively in parallelogram centered at lattice points of a hexagonal lattice and parallelogram centered at lattice points of a parallelogram lattice configurations.

According to above description, this invention discloses a power device includes a plurality of vertical MOSFET cells wherein each cell includes a drain disposed at a bottom surface of a substrate, a source region surrounded by a body region under a top surface of the substrate and a gate with a polysilicon opening disposed substantially near a center portion of the cell and overlaying a top surface of the substrate with a portion covering the source region and the body region thereunder wherein the polysilicon opening having a non-orthogonal parallelogram shape for each of the transistor cells. In a preferred embodiment, the transistor cells having the polysilicon opening of the non-orthogonal parallelogram shape are arranged with every four of the cells constituting substantially a non-orthogonal parallelogram shape. In a preferred embodiment, the transistor cells with the polysilicon opening of the non-orthogonal parallelogram shape are arranged with every four of the cells constituting sides of equal length. In a preferred embodiment, the transistor cells with the polysilicon opening of the non-orthogonal parallelogram shape are arranged with every seven of the cells constituting substantially a hexagonal shape including six outer cells defining a boundary of the hexagonal shape and one inner cell contained therein.

Figure 9A:
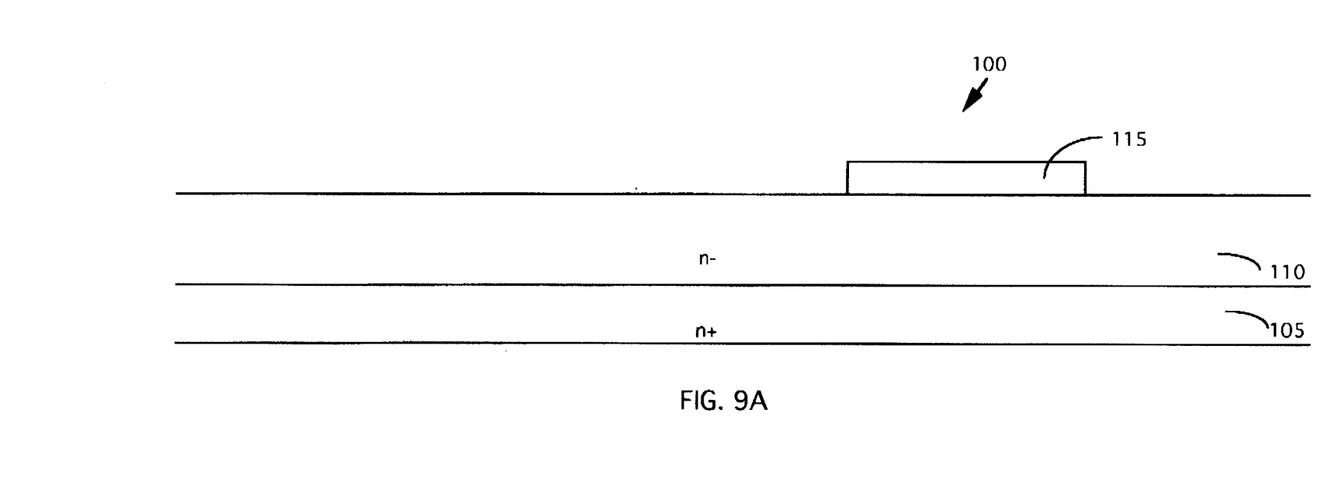
FIGS. 9A to 9D show the processing steps for manufacturing the MOSFET device of FIG. 3.
Figure 9B:
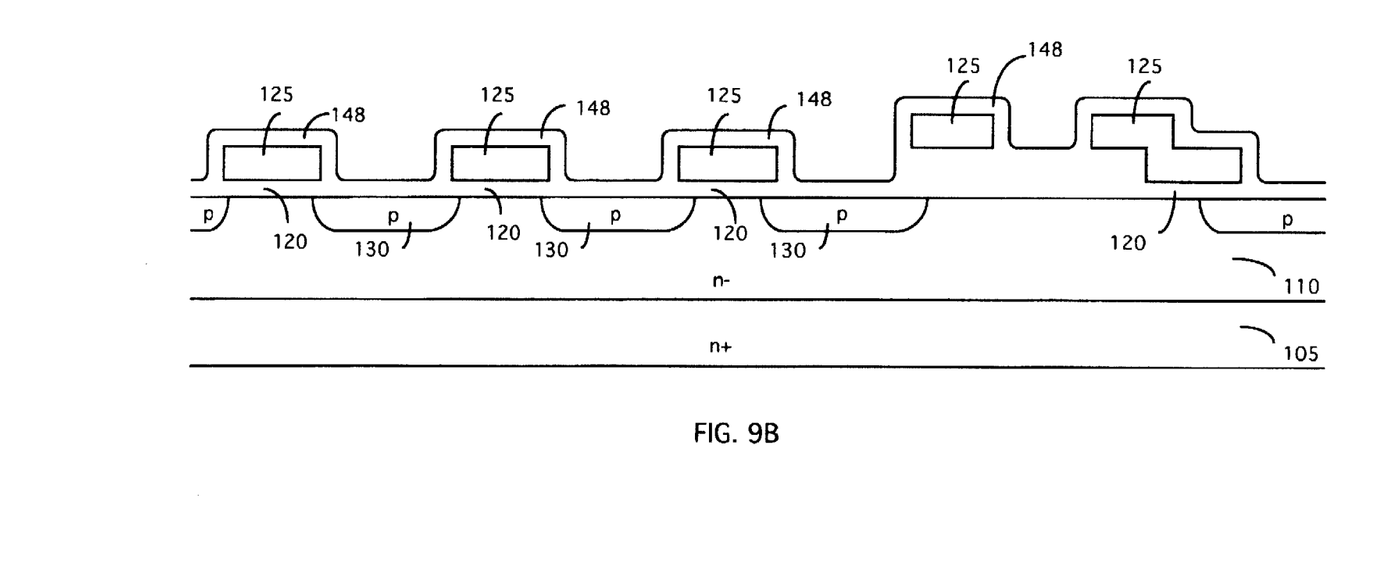

Please refer to FIGS. 9A to 9D for the processing steps in manufacturing the MOSFET device 100 as describe above. As shown in FIG. 9A, the processing steps begins by first growing a N⁻ epitaxial layer 110 with a resistivity ranging from 0.1 to 1.0 ohm-cm on top of a N+ substrate 105. The substrate has a resistivity of 0.001 to 0.007 ohm-cm. The thickness and the resistivity of the epitaxial layer 110 depend on the device requirements for the on-resistance and breakdown voltage. In a preferred embodiment, the thickness of the epi-layer 110 is about six to eight microns. An initial oxide layer 115 of thickness in the range of 5,000 to 10,000 Å is grown which is then etched by applying a mask to define the active areas. In FIG. 9B, a gate oxidation process is first carried out to form a gate oxide layer 120. A polysilicon layer 125 is then deposited on the gate oxide layer 120. A POCL$_3$ doping process is carried out followed by an arsenic (As) implant process with an ion beam of energy at 60–80 Kev with a flux density of 5 to $8\times10^{15}$/cm². A polysilicon mask is then applied to carry out the an anisotropic etching process to define the polysilicon gate 125 wherein the polysilicon gate 125 are formed with parallelogram shape as that shown in FIGS. 3A and 3B with a portion of the polysilicon layer 120 removed between adjacent core cells 102. The resist is then stripped and a p-body implant at 30–100 Kev with an ion beam of $3\times10^{13}$ to $3\times10^{14}$/cm² flux density is applied to implant the p-body regions 130. A p-body diffusion process is then carried out at an elevated temperature of 1,000°–1,200° C. for ten minutes to increase the depth of the p-body region 120 to 1.0–2.0μ. A silicide layer 148 is then formed covering the top surface.

Figure 9C:
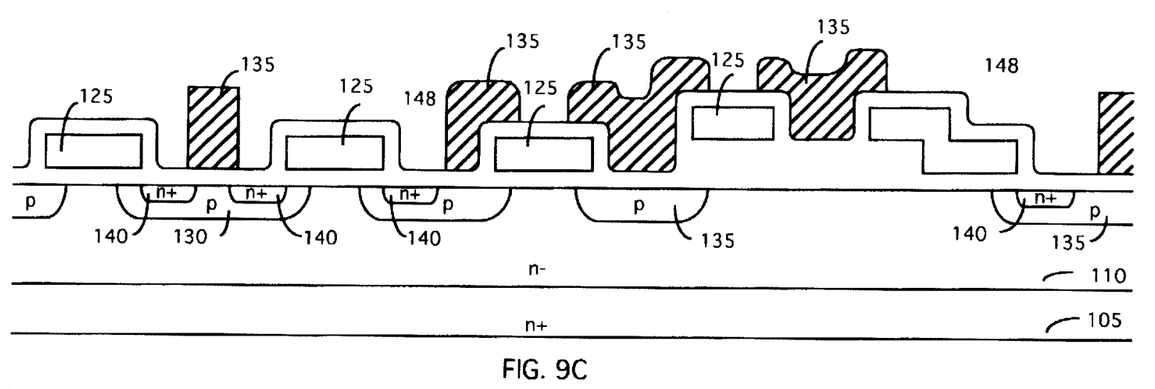
Figure 9D:
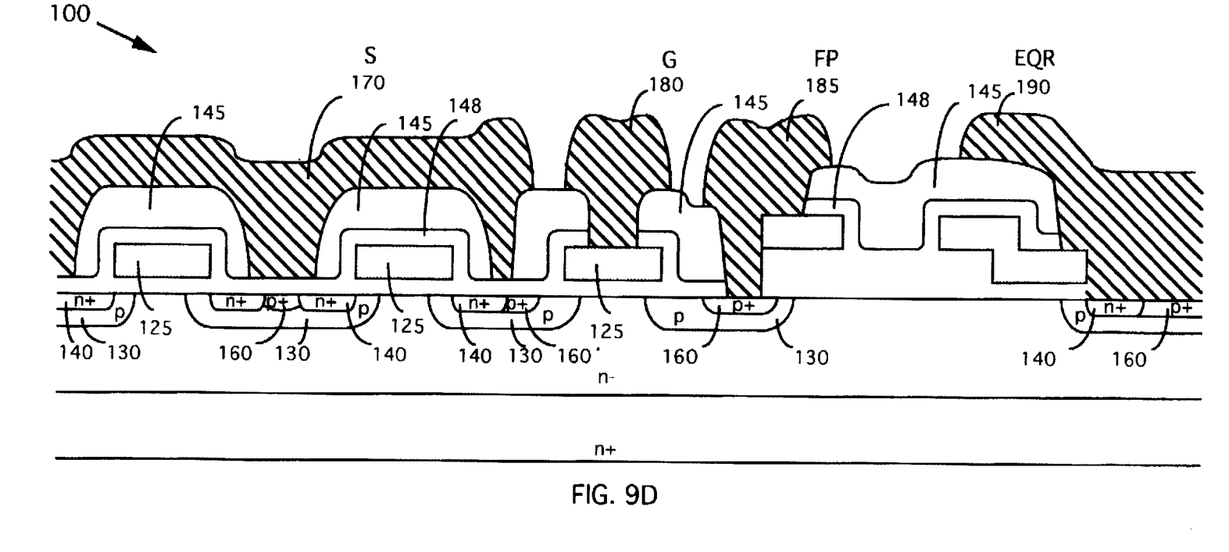

Referring to FIG. 9C, a N+ block mask 135 is applied to carry out an N⁺ implant to form the N⁺ region 140. The N⁺ implantation is carried out with an ion beam at an energy of 60–100 Kev and ion flux density of $5\times10^{15}$ to $1\times10^{16}$/cm². After the resist, i.e., the parallelogram-shaped N⁺ blocking mask 135, is stripped, the N⁺ source regions 140 are driven into desired junction depth ranging from 0.2 to 1.0μ by a diffusion process. Referring to FIG. 9D, a BPSG or PSG is deposited to form a layer 145 of approximately 5000–15,000 Å in thickness. A BPSG flow or PSG densification process is performed at 900°–950° C. for thirty minutes to one hour. A contact mask is applied to perform an etching process to define the contact windows. A p+ ion implantation is carried out to form the p+ region 160 by a p+ activation process at 900°–950° C. in an oxidation or inert gas ambient. The final power MOSFET device 100 is completed with the metal deposition and metal etching with a metal mask to define the source contacts (S) 170, the gate contacts (G) 180, the field plate (FP) 185, and equal potential ring (EQR) 190. Since these metal contacts are well known in the art and are not the major features of this invention, they are not specifically described in details for the sake of simplicity and being more clearly focused on the main features of the invention.

According to FIGS. 4A and 4B and FIGS. 9A to 9D, this invention discloses a power transistor cell 100 supported on a semiconductor substrate 105 with a top surface and a bottom surface. The power transistor cell includes a drain region, doped with impurities of a first conductivity type, formed at the bottom surface. The power transistor cell further includes a polysilicon gate layer overlaying the top surface includes a polysilicon opening disposed substantially in a central portion of the transistor cell with a remaining portion of the polysilicon layer constituting a gate and defining an outer boundary for the transistor cell wherein the polysilicon opening and the outer boundary defined by the gate for the transistor cell constituting substantially non-orthogonal parallelograms. The power transistor further includes a source region, doped with the first conductivity type, disposed in the substrate underneath and around an outer edge of the source opening with a small portion extends underneath the gate. The power transistor further includes a body region, doped with a second conductivity type, disposed in the substrate surrounding the source region and an entire portion of the substrate underneath the polysilicon opening having a small portion extends underneath the gate near the cell boundary. The packing density of the transistor cell 100 can be improved with the parallelogram cell occupies less areas, e.g., $(a+b)^2(1-SIN\theta)$, than the area occupied by a regular square cell, e.g., $(a+b)^2$, having the same total channel width, e.g., 4a.

In summary, this invention discloses a vertical power transistor cell disposed on a semiconductor substrate provided as drain at a bottom surface and a source region, a gate disposed on a top surface, and a source and a body region each with a portion under the gate. In this transistor cell, the gate defining a gate-layer opening constituting substantially a non-orthogonal parallelogram. In a preferred embodiment, the source region is doped with dopant of a first conductivity type and the first conductivity type is an N type conductivity and the transistor cell constituting an N-channel power transistor. In another preferred embodiment, the source region is doped with dopant of a first conductivity type and the first conductivity type is an P type conductivity and the transistor cell constituting an P-channel power transistor. In another preferred embodiment, the gate having an outer edge defining an outer boundary of the cell constituting substantially a non-orthogonal parallelogram. In another preferred embodiment, the gate layer opening defining the non-orthogonal parallelogram with a sharp angle about sixty degrees (60°). In another preferred embodiment, the gate layer opening defining the non-orthogonal parallelogram with a sharp angle about fourty-five degrees (45°). In another preferred embodiment, the gate layer opening defining the non-orthogonal parallelogram wherein two sharp angles are blunted. In another preferred embodiment, the gate layer opening defining the non-orthogonal parallelogram wherein two sharp angles are rounded.

Figure 10A:
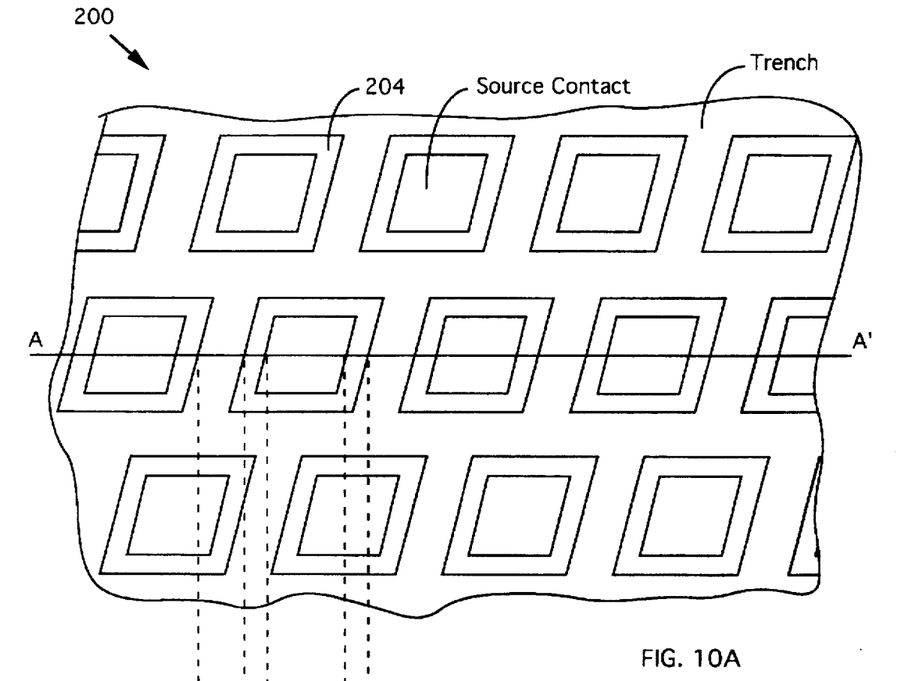
FIGS. 10A and 10B show a top view and a cross sectional view of an array of trenched DMOS cells with improved packing density according to the cell topology disclosed in this invention.
Figure 10B:
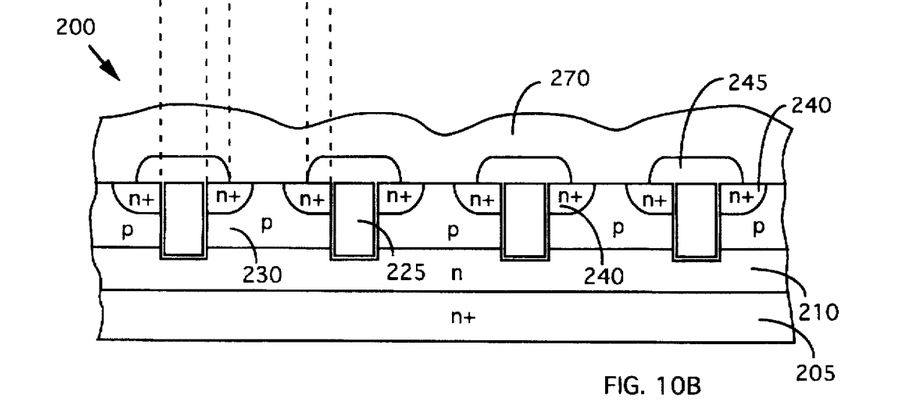

FIGS. 10A and 10B are the top view and cross sectional view of a power device 200 which include an array of trenched MOSFET cells 204. Each of these cells 204 includes a trenched gate 225 surround by a source region 240 which are in source contact 270. A deeper p-body region 230 surrounds the source region and extends outwordly toward the outer boundary of the transistor cell. The trenched gate 225 includes a trench opened in the substrate and filled with a dielectric material such as polysilicon. The manufacturing process for the trenched cells are well known in the art and since the fabrication process is not the main theme of this invention, no detail description would be necessary for a clear understanding of this invention. According to the top view, each of these the cells 204 defines a non-orthogonal parallelogram. Again, for this novel cell topology for a trenched power transistor cell, the packing density, i.e., total unit cell channel width per total unit cell area, is improved because the total unit cell area is reduced when compared to a regular square cell.

According to FIGS. 10A and 10B, this invention also discloses a trenched power transistor cell supported on a semiconductor substrate having a top surface and a bottom surface. The trenched transistor cell includes a drain region, doped with impurities of a first conductivity type, formed at the bottom surface. The trenched cell further includes a trenched polysilicon gate disposed in a trench, opened from the top surface. The trenched cell further includes a source region, doped with the first conductivity type, disposed in the substrate immediately next to the and surrounding the trenched gate constituting substantially a ring of non-orthogonal parallelogram shape. The trenched cell further includes a body region, doped with a second conductivity type, disposed in the substrate surrounding and underneath the source region thus occupying an entire portion of the substrate underneath the source opening. The trenched cell further includes an outer boundary of the cell defined by a central line of the trenched polysilicon gate constituting substantially a ring of non-orthogonal parallelogram shape. In summary this invention also discloses a trenched vertical power transistor cell disposed on a semiconductor substrate provided as drain at a bottom surface and a source region, a trenched gate disposed in a trench opened from a top surface, and a source and a body region each with a portion disposed next to the gate. In this trenched transistor cell the trenched gate having centerline defining an outer boundary of the cell constituting substantially a non-orthogonal parallelogram.

Therefore, the present invention provides a new and improved MOSFET cell topology to overcome the limitations encountered in the prior art. Specifically, the present invention provides a new and improved MOSFET cell topology wherein the packing density is increased by manufacturing the transistor cells as non-orthogonal parallelograms wherein the packing density is increased with the same total channel width formed in a smaller cell area when compared to that of square cells as that commonly used in the prior art such that the cell size can be further reduced without sacrificing the total channel width. In the non-orthogonal parallelograms, the sharper corners are blunted or rounded whereby the punch through vulnerability at the weak points in these sharper corners of the non-orthogonal parallelogram cells may be removed. The processing flow employed in manufacturing the transistor cells can be applied without requiring significant changes thus greatly simplifying a switch over to the new transistor cell topology of this invention.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A power transistor cell supported on a semiconductor substrate having a top surface and a bottom surface, the cell comprising:

a drain region, doped with impurities of a first conductivity type, formed at said bottom surface;

a polysilicon gate layer overlaying said top surface includes a polysilicon opening disposed substantially in a central portion of said transistor cell with a remaining portion of said polysilicon layer constituting a gate and defining an outer boundary for said transistor cell wherein said polysilicon opening and said outer boundary defined by said gate for said transistor cell constituting substantially non-orthogonal parallelograms;

a source region, doped with said first conductivity type, disposed in said substrate underneath and around an outer edge of said polysilicon opening with a small portion extends underneath said gate; and a body region, doped with a second conductivity type, disposed in said substrate surrounding said source region and an entire portion of said substrate underneath said polysilicon opening having a small portion extends underneath said gate near said cell boundary.

2. The power transistor cell as recited in claim 1 wherein: said first conductivity type is an N type conductivity and said transistor cell constituting an N-channel power transistor.

3. The power transistor cell as recited in claim 1 wherein: said first conductivity type is an P type conductivity and said transistor cell constituting an P-channel power transistor.

4. The power transistor cell as recited in claim 1 wherein: said polysilicon opening defining said non-orthogonal parallelogram with a sharp angle about sixty degrees (60°).

5. The power transistor cell as recited in claim 1 wherein:
   said polysilicon opening defining said non-orthogonal parallelogram with a sharp angle about forty-five degrees (45°).

6. The power transistor cell as recited in claim 1 wherein:
   said polysilicon opening defining said non-orthogonal parallelogram wherein two sharp angles are blunted.

7. The power transistor cell as recited in claim 1 wherein:
   said polysilicon opening defining said non-orthogonal parallelogram wherein two sharp angles are rounded.

8. A power device includes a plurality of vertical MOSFET cells wherein each cell includes a drain disposed at a bottom surface of a substrate, a source region surrounded by a body region under a top surface of said substrate and a gate with a polysilicon opening disposed substantially near a center portion of said cell and overlaying a top surface of said substrate with a portion covering said source region and said body region thereunder wherein:
   said polysilicon opening having a non-orthogonal parallelogram shape for each of said transistor cells.

9. The power device as recited in claim 8 wherein:
   said transistor cells having said polysilicon opening of said non-orthogonal parallelogram shape are arranged with every four of said cells constituting substantially a non-orthogonal parallelogram shape.

10. The power device as recited in claim 8 wherein:
    said transistor cells with said polysilicon opening of said non-orthogonal parallelogram shape are arranged with every four of said cells constituting sides of equal length.

11. The power device as recited in claim 8 wherein:
    said transistor cells with said polysilicon opening of said non-orthogonal parallelogram shape are arranged with every seven of said cells constituting substantially a hexagonal shape including six outer cells defining a boundary of said hexagonal shape and one inner cell contained therein.

12. A vertical power transistor cell disposed on a semiconductor substrate provided as drain at a bottom surface and a source region, a gate disposed on a top surface, and a source and a body region each with a portion under the gate, wherein:
    said gate defining a gate-layer opening constituting substantially a non-orthogonal parallelogram.

13. The vertical transistor cell as recited in claim 12 wherein:
    said source region is doped with dopant of a first conductivity type and said first conductivity type is an N type conductivity and said transistor cell constituting an N-channel power transistor.

14. The vertical transistor cell as recited in claim 12 wherein:
    said source region is doped with dopant of a first conductivity type and said first conductivity type is an P type conductivity and said transistor cell constituting an P-channel power transistor.

15. The vertical transistor cell as recited in claim 12 wherein:
    said gate having an outer edge defining an outer boundary of said cell constituting substantially a non-orthogonal parallelogram.

16. The vertical transistor cell as recited in claim 12 wherein:
    said gate layer opening defining said non-orthogonal parallelogram with a sharp angle about sixty degrees (60°).

17. The power transistor cell as recited in claim 12 wherein:
    said gate layer opening defining said non-orthogonal parallelogram with a sharp angle about forty-five degrees (45°).

18. The power transistor cell as recited in claim 12 wherein:
    said gate layer opening defining said non-orthogonal parallelogram wherein two sharp angles are blunted.

19. The power transistor cell as recited in claim 12 wherein:
    said gate layer opening defining said non-orthogonal parallelogram wherein two sharp angles are rounded.

20. The vertical transistor cell as recited in claim 12 further comprising:
    a source contact opening disposed near a center portion of said transistor cell provided for forming a source contact therein to contact said source region wherein said source contact opening constituting substantially a non-orthogonal parallelogram.

21. A trenched power transistor cell supported on a semiconductor substrate having a top surface and a bottom surface, the cell comprising:
    a drain region, doped with impurities of a first conductivity type, formed at said bottom surface;
    a trenched polysilicon gate disposed in a trench, opened from said top surface;
    a source region, doped with said first conductivity type, disposed in said substrate immediately next to said and surrounding said trenched gate constituting substantially a ring of non-orthogonal parallelogram shape;
    a body region, doped with a second conductivity type, disposed in said substrate surrounding and underneath said source region thus occupying an entire portion of said substrate underneath said source opening; and
    an outer boundary of said cell defined by a central line of said trenched polysilicon gate constituting substantially a ring of non-orthogonal parallelogram shape.

22. The trenched power transistor cell as recited in claim 21 wherein:
    said first conductivity type is an N type conductivity and said transistor cell constituting an N-channel trenched power transistor.

23. The trenched power transistor cell as recited in claim 21 wherein:
    said first conductivity type is an P type conductivity and said transistor cell constituting an P-channel trenched power transistor.

24. The trenched power transistor cell as recited in claim 21 wherein:
    said outer boundary of said transistor cell defined by said centerline of said trenched polysilicon gate constituting said non-orthogonal parallelogram having a sharp angle about sixty degrees (60°).

25. The trenched power transistor cell as recited in claim 21 wherein:
    said outer boundary of said transistor cell defined by said centerline of said trenched polysilicon gate constituting said non-orthogonal parallelogram having a sharp angle about forty-five degrees (45°).

26. A trenched power device includes a plurality of vertical MOSFET cells wherein each cell includes a drain disposed at a bottom surface of a substrate, a trenched gate surrounding said cell, a source region disposed immediately next to said trenched gate surrounded by a body region under a top surface of said substrate with a source contact opening disposed substantially near a center portion of said cell and overlaying a top surface of said substrate with a portion covering said source region and said body region thereunder wherein:

a centerline of said trenched gate defining an outer boundary constituting a non-orthogonal parallelogram for each of said transistor cells.

27. The trenched power device as recited in claim 26 wherein:

said trenched transistor cells constituting said non-orthogonal parallelogram are arranged with every four of said cells constituting substantially a non-orthogonal parallelogram shape.

28. The trenched power device as recited in claim 26 wherein:

said trenched transistor cells constituting said non-orthogonal parallelogram are arranged with every four of said cells constituting sides of equal length.

29. The power device as recited in claim 26 wherein:

said trenched transistor cells constituting said non-orthogonal parallelogram are arranged with every seven of said cells constituting substantially a hexagonal shape including six outer cells defining a boundary of said hexagonal shape and one inner cell contained therein.

30. A trenched vertical power transistor cell disposed on a semiconductor substrate provided as drain at a bottom surface and a source region, a trenched gate disposed in a trench opened from a top surface, and a source and a body region each with a portion disposed next to the gate, wherein:

said trenched gate having centerline defining an outer boundary of said cell constituting substantially a non-orthogonal parallelogram.

31. The vertical transistor cell as recited in claim 30 wherein:

said source region is doped with dopant of a first conductivity type and said first conductivity type is an N type conductivity and said trenched transistor cell constituting an N-channel power transistor.

32. The vertical transistor cell as recited in claim 30 wherein:

said source region is doped with dopant of a first conductivity type and said first conductivity type is an P type conductivity and said trenched transistor cell constituting an P-channel power transistor.

33. The trenched transistor cell as recited in claim 30 further includes:

a source contact opening constituting substantially a non-orthogonal parallelogram near a center portion of said transistor cell.

34. The trenched transistor cell as recited in claim 30 wherein:

said outer boundary of said transistor cell defining said non-orthogonal parallelogram with a sharp angle about sixty degrees (60°).

35. The power transistor cell as recited in claim 30 wherein:

said outer boundary of said transistor cell defining said non-orthogonal parallelogram with a sharp angle about forty-five degrees (45°).

36. The power transistor cell as recited in claim 30 wherein:

said centerline of said trenched gate defining said non-orthogonal parallelogram with two sharp angles blunted.

37. The power transistor cell as recited in claim 30 wherein:

said centerline of said trenched gate defining said non-orthogonal parallelogram with two sharp angles rounded.

* * * * *